(12) United States Patent
Rana et al.

(10) Patent No.: US 8,026,148 B2
(45) Date of Patent: Sep. 27, 2011

(54) METHODS OF UTILIZING SILICON DIOXIDE-CONTAINING MASKING STRUCTURES

(75) Inventors: Niraj B. Rana, Boise, ID (US); Nishant Sinha, Boise, ID (US); Prashant Raghu, Boise, ID (US); Jim J. Hofmann, Boise, ID (US); Neil Joseph Greeley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/004,967

(22) Filed: Jan. 12, 2011

(65) Prior Publication Data
US 2011/0111597 A1    May 12, 2011

Related U.S. Application Data

(62) Division of application No. 12/252,499, filed on Oct. 16, 2008, now Pat. No. 7,892,937.

(51) Int. Cl.
*H01L 21/20* (2006.01)

(52) U.S. Cl. . 438/396; 438/689; 438/695; 257/E21.017; 257/E21.219

(58) Field of Classification Search .......... 438/257–267, 438/696, 717, 396, 397, 398, 694, 695, 700; 257/E21.017, E21.02, E21.219, E21.245, 257/E21.246
See application file for complete search history.

(56) References Cited

U.S. PATENT DOCUMENTS

| | | | |
|---|---|---|---|
| 6,404,028 B1 | 6/2002 | Hetrick et al. | |
| 6,667,502 B1 | 12/2003 | Agarwal et al. | |
| 6,815,361 B1 | 11/2004 | Bae et al. | |
| 6,859,542 B2 | 2/2005 | Johannsen et al. | |
| 7,084,448 B2 | 8/2006 | DeBoer et al. | |
| 7,700,469 B2 | 4/2010 | Benson | |
| 2004/0071863 A1 | 4/2004 | Zhu et al. | |
| 2005/0051822 A1 | 3/2005 | Manning | |
| 2005/0054159 A1 | 3/2005 | Manning et al. | |
| 2005/0158949 A1 | 7/2005 | Manning | |
| 2005/0167724 A1* | 8/2005 | Choi et al. | 257/308 |
| 2005/0287780 A1 | 12/2005 | Manning et al. | |
| 2006/0014344 A1 | 1/2006 | Manning | |
| 2006/0046420 A1 | 3/2006 | Manning | |
| 2006/0051918 A1 | 3/2006 | Busch et al. | |
| 2006/0063344 A1 | 3/2006 | Manning et al. | |
| 2006/0063345 A1 | 3/2006 | Manning et al. | |
| 2006/0121672 A1 | 6/2006 | Basceri et al. | |
| 2006/0211211 A1 | 9/2006 | Sandhu et al. | |
| 2006/0261440 A1 | 11/2006 | Manning | |
| 2006/0263968 A1 | 11/2006 | Manning | |
| 2007/0032014 A1 | 2/2007 | Sandhu et al. | |
| 2008/0268594 A1* | 10/2008 | Kim | 438/258 |

\* cited by examiner

*Primary Examiner* — Brook Kebede
(74) *Attorney, Agent, or Firm* — Wells St. John P.S.

(57) ABSTRACT

Some embodiments include methods of forming capacitors. Storage nodes are formed within a material. The storage nodes have sidewalls along the material. Some of the material is removed to expose portions of the sidewalls. The exposed portions of the sidewalls are coated with a substance that isn't wetted by water. Additional material is removed to expose uncoated regions of the sidewalls. The substance is removed, and then capacitor dielectric material is formed along the sidewalls of the storage nodes. Capacitor electrode material is then formed over the capacitor dielectric material. Some embodiments include methods of utilizing a silicon dioxide-containing masking structure in which the silicon dioxide of the masking structure is coated with a substance that isn't wetted by water.

13 Claims, 13 Drawing Sheets

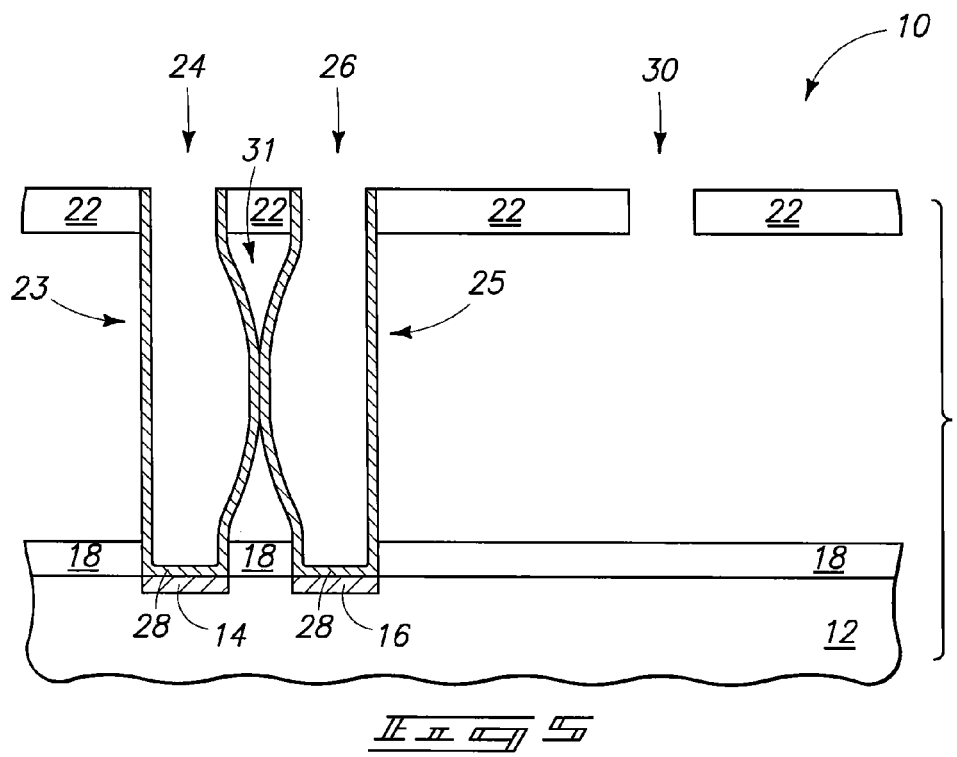
_FIG 5_
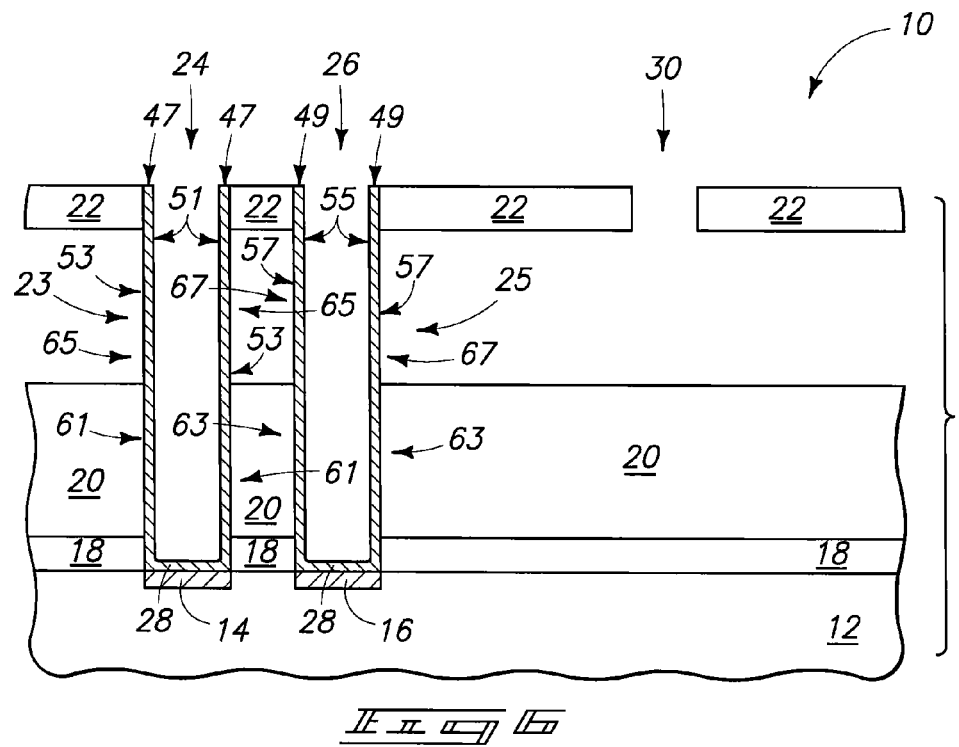
_FIG 6_

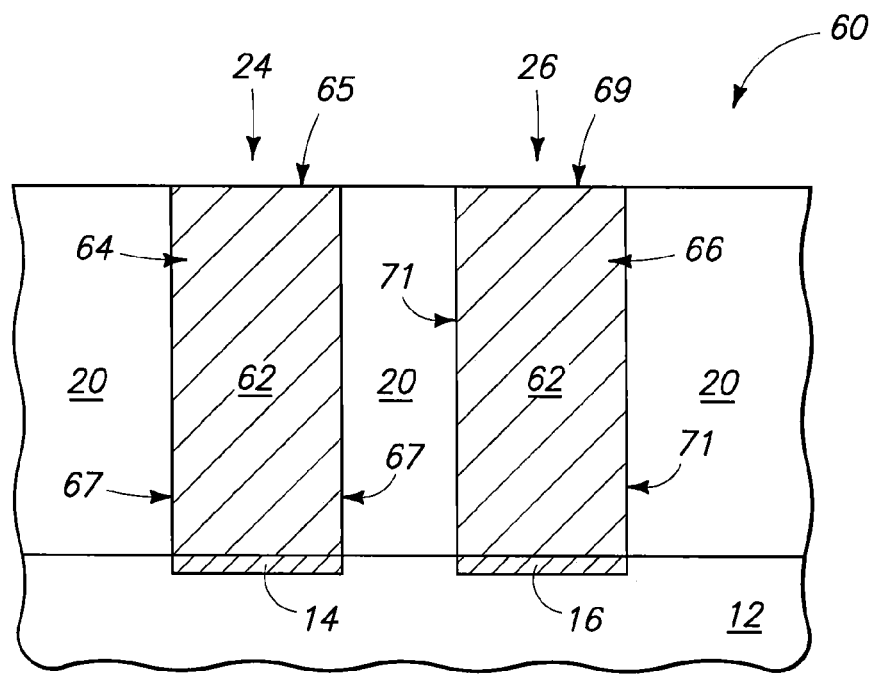
F I G   13
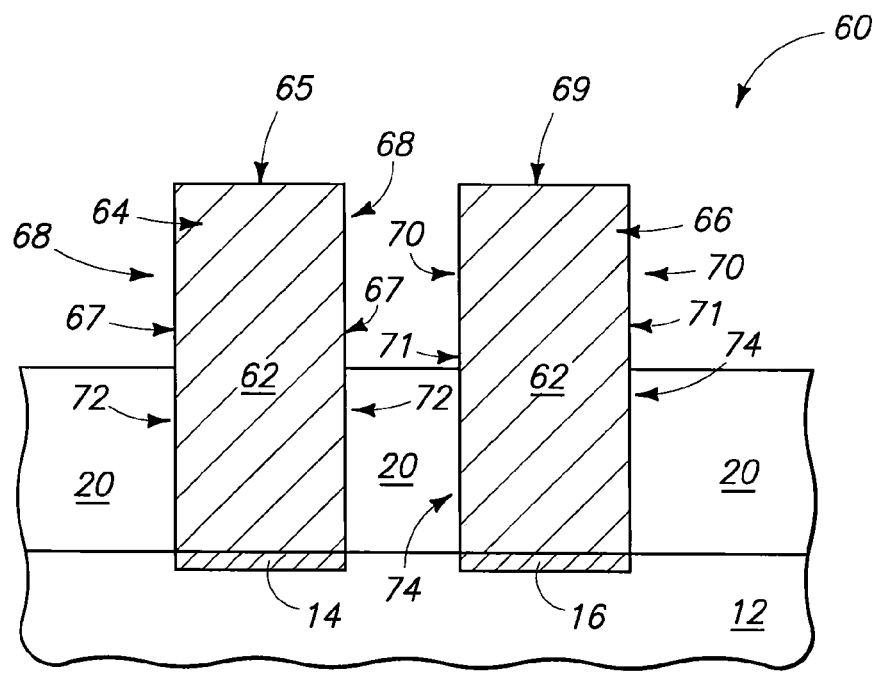
F I G   14

METHODS OF UTILIZING SILICON DIOXIDE-CONTAINING MASKING STRUCTURES

RELATED PATENT DATA

This patent resulted from a divisional of U.S. patent application Ser. No. 12/252,499, which was filed Oct. 16, 2008, and which is hereby incorporated herein by reference.

TECHNICAL FIELD

Methods of forming capacitors, and methods of utilizing silicon dioxide-containing masking structures.

BACKGROUND

A continuing goal of integrated circuit fabrication is to increase integration density. An approach utilized for achieving increased integration density is to reduce the footprint of individual electrical components so that more components can be fit across a unit of semiconductor real estate. For instance, capacitors have become increasingly tall and thin in an effort to reduce the footprint of individual capacitors, while retaining desired levels of capacitance.

A problem that can occur as capacitors become tall and thin is that the tall, thin storage node structures formed during fabrication of the capacitors may tip, or even topple, during a fabrication process. Accordingly, various structures have been developed to provide support to the storage node structures. Example support structures are lattice structures, such as those described in U.S. Pat. No. 6,667,502, and in U.S. Patent Publication Numbers 2005/0051822 and 2005/0054159.

Another problem that may occur during fabrication of tall, thin storage nodes is that spaces between adjacent storage nodes may function as capillaries during an etching process, and/or during a rinsing process, so that solution is drawn into such spaces. Adhesion of the solution with the adjacent storage nodes may pull the adjacent storage nodes into one another, and the storage nodes may then stick to one another. The sticking of the storage nodes to one another may be referred to as stiction.

A prior art capacitor storage node fabrication process is described with reference to FIGS. 1-5 to illustrate the stiction problem.

Referring to prior art FIG. 1, a portion of a semiconductor construction 10 is illustrated. The construction includes a semiconductor base 12. The base 12 may be, for example, a semiconductor wafer, such as a monocrystalline silicon wafer. The base 12, alone or in combination with various materials, may be referred to as a "semiconductive substrate" or "semiconductor substrate." The terms "semiconductive substrate" and "semiconductor substrate" mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

A pair of electrically conductive nodes 14 and 16 are supported by base 12. The nodes may be, for example, conductively doped regions of the semiconductor wafer and/or pedestals (for instance, metal-containing pedestals).

A plurality of materials 18, 20 and 22 are over base 12, and over nodes 14 and 16. The materials 18, 20 and 22 may be undoped silicon dioxide, doped silicate glass, and silicon nitride, respectively. The doped silicate glass may be, for example, phosphosilicate glass (PSG), borophosphosilicate glass (BPSG), fluorosilicate glass (FSG), etc. The material 20 may be referred to as a support material, in that it ultimately supports capacitor storage nodes (as discussed below), and the material 22 may be referred to as a lattice material in that it ultimately forms a lattice to provide additional support for the capacitor storage nodes.

Referring to FIG. 2, openings 24 and 26 are formed through materials 18, 20 and 22, and to nodes 14 and 16, respectively. The openings may be formed by providing a photolithographically-patterned photoresist mask (not shown) over material 22; transferring a pattern from the photoresist mask to materials 18, 20 and 22 with one or more etches, and then removing the mask to leave the structure shown in FIG. 2.

Referring to FIG. 3, electrically conductive storage node material 28 is formed within openings 24 and 26. The storage node material may comprise titanium nitride. The storage node material may be formed by depositing the storage node material within the openings and over material 22, and then removing the storage node material from over material 22 with chemical-mechanical polishing (CMP). The storage node material forms storage nodes 23 and 25 within openings 24 and 26, respectively.

Referring to FIG. 4, an opening 30 is formed through material 22 to expose the underlying support material 20. Opening 30 may be representative of a plurality of openings formed through material 22 so that all of material 20 may be removed with a subsequent isotropic etch (discussed below with reference to FIG. 5). Opening 30 may be formed by providing a photolithographically-patterned photoresist mask (not shown) over material 22; transferring a pattern from the photoresist mask to material 22 with an etch, and then removing the mask to leave the structure shown in FIG. 4.

Referring to FIG. 5, support material 20 (FIG. 4) is removed with an isotropic etch. It appears that material 22 is floating in the view of FIG. 5, because the only structures shown in FIG. 5 are those within the cross-sectional plane of the figure. Structures out of the plane are not illustrated in order to simplify the drawing. The material 22 is thus not floating at the processing stage of FIG. 5, but instead is supported by regions that are not visible in the cross-section shown in FIG. 5. The supporting regions may be analogous to those shown and described in U.S. Patent Publication No. 2005/0054159.

Support material 20 (FIG. 4) may be removed with an aqueous etchant comprising about 5% (by volume) hydrofluoric acid in water. After the etching of material 20, the etchant may be removed by a rinse with deionized water, and then the deionized water may be removed by drying the construction 10 (i.e., the water may be volatilized from the construction). The drying may be enhanced through utilization of isopropyl alcohol, acetone and/or other azeotropic solvents.

A capillary 31 forms between adjacent storage nodes 23 and 25. Solvent within such capillary during etching, rinsing and/or drying may pull the material 28 of storage node 23 into the material 28 of storage node 25. The material 28 of storage node 23 sticks to the material 28 of storage node 25 through stiction forces, and thus a short is formed and maintained between the two storage nodes 23 and 25.

It would be desirable to develop new methods of patterning capacitors which alleviate or prevent the shorting illustrated in FIG. 5. It would be further desirable for the new methods to have applications beyond fabrication of capacitors.

BRIEF DESCRIPTION OF THE DRAWINGS

FIGS. 1-5 are diagrammatic cross-sectional views of a portion of a semiconductor construction illustrating various stages of a prior art process for forming capacitor storage nodes.

FIGS. 6-10 are diagrammatic cross-sectional views of a portion of a semiconductor construction illustrating various stages of an example embodiment process for forming capacitors. The processing stage of FIG. 6 is subsequent to that of prior art FIG. 4.

FIGS. 12-18 are diagrammatic cross-sectional views of a portion of a semiconductor construction illustrating various stages of another example embodiment process for forming capacitors.

FIG. 24 illustrates a "contact angle," of the liquid relative to the underlying substrate.

DETAILED DESCRIPTION OF THE ILLUSTRATED EMBODIMENTS

Some embodiments include methods in which surfaces are protected with hydrophobic and/or non-wetting material to alleviate, and possibly even prevent, stiction between adjacent surfaces during subsequent etching, rinsing and/or drying processes. The term "non-wetting" is utilized with its traditional meaning that a contact angle between water and a "non-wetting" surface is greater than 90°. The term "non-wetting" is used herein to refer to non-wettability relative to aqueous compositions, rather than to other types of liquids.

Figure 23:
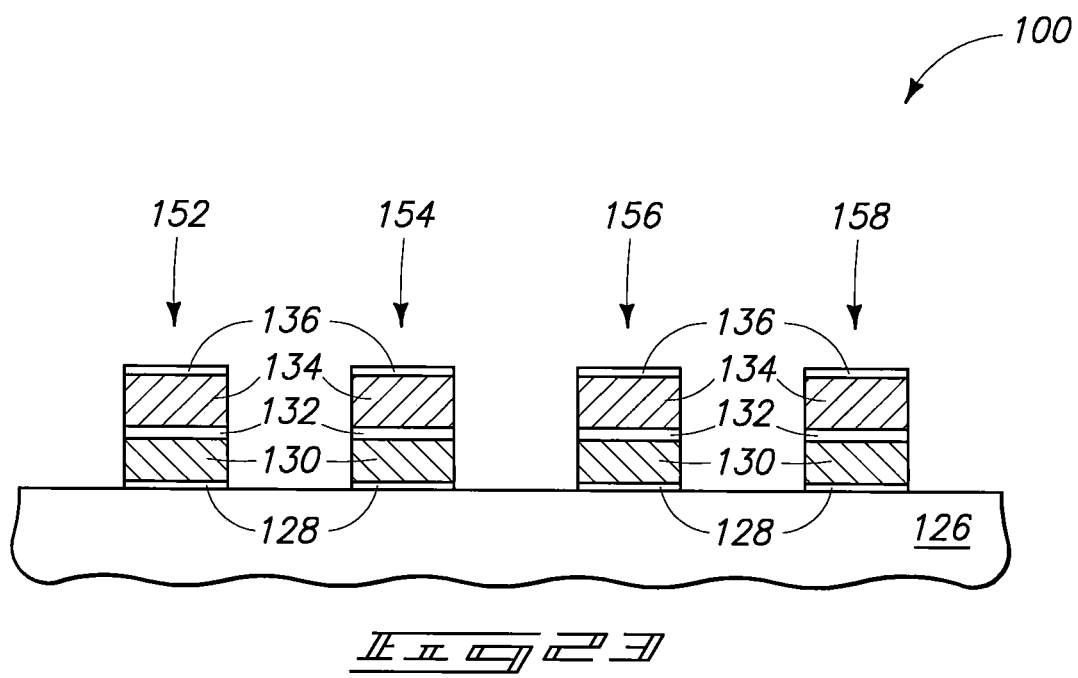
Figure 24:
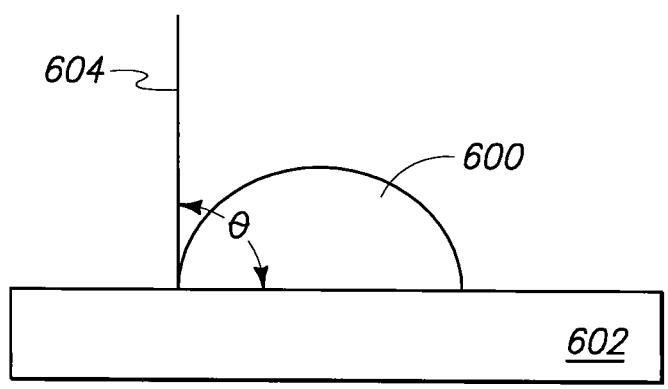
FIG. 24 is a diagrammatic cross-sectional view of a drop of liquid on a substrate.

FIG. 24 illustrates a drop of liquid 600 over a substrate 602, and shows a line 604 tangent to a surface of liquid 600 at a three-phase boundary where the liquid, solid (a surface of substrate 602) and a gas (the atmosphere around the liquid and substrate) intersect. The contact angle is defined as the angle between line 604 and the surface of substrate 602, and is labeled θ in the diagram of FIG. 24. In some embodiments, a hydrophobic material may be chosen such that it forms a contact angle of at least 60° with an aqueous solution, at least 70° with an aqueous solution, at least 90° with an aqueous solution, or at least 100° with an aqueous solution. Example embodiments are described with reference to FIGS. 6-23; with FIGS. 6-10 illustrating a first embodiment, FIG. 11 illustrating a second embodiment, FIGS. 12-18 illustrating a third embodiment, and FIGS. 19-23 illustrating a fourth embodiment.

Figure 1:
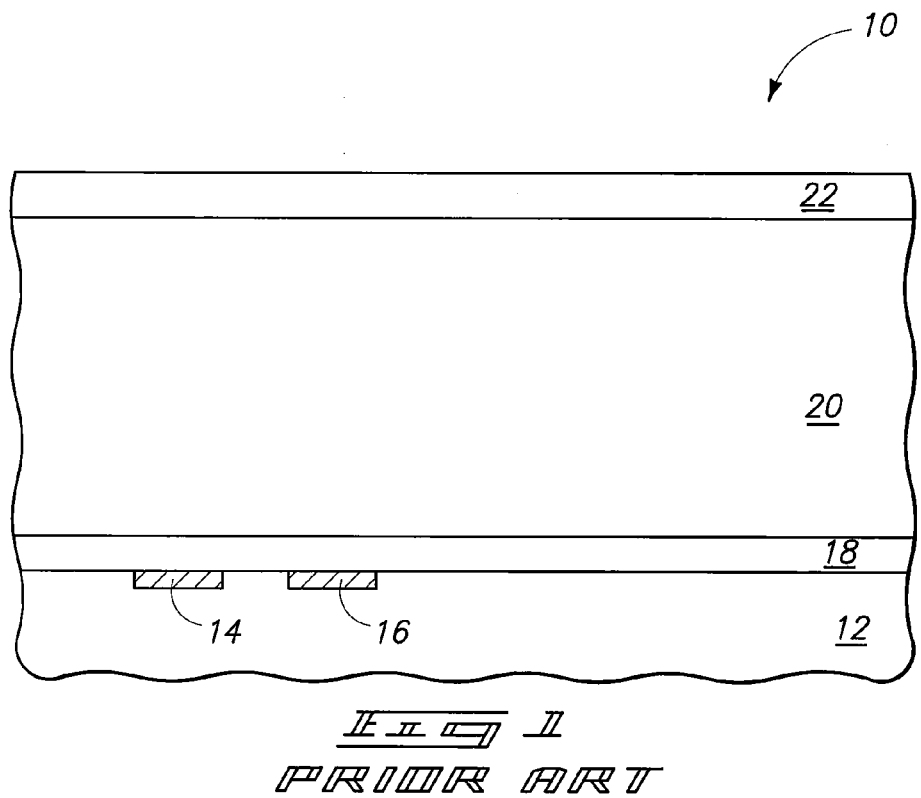
Figure 2:
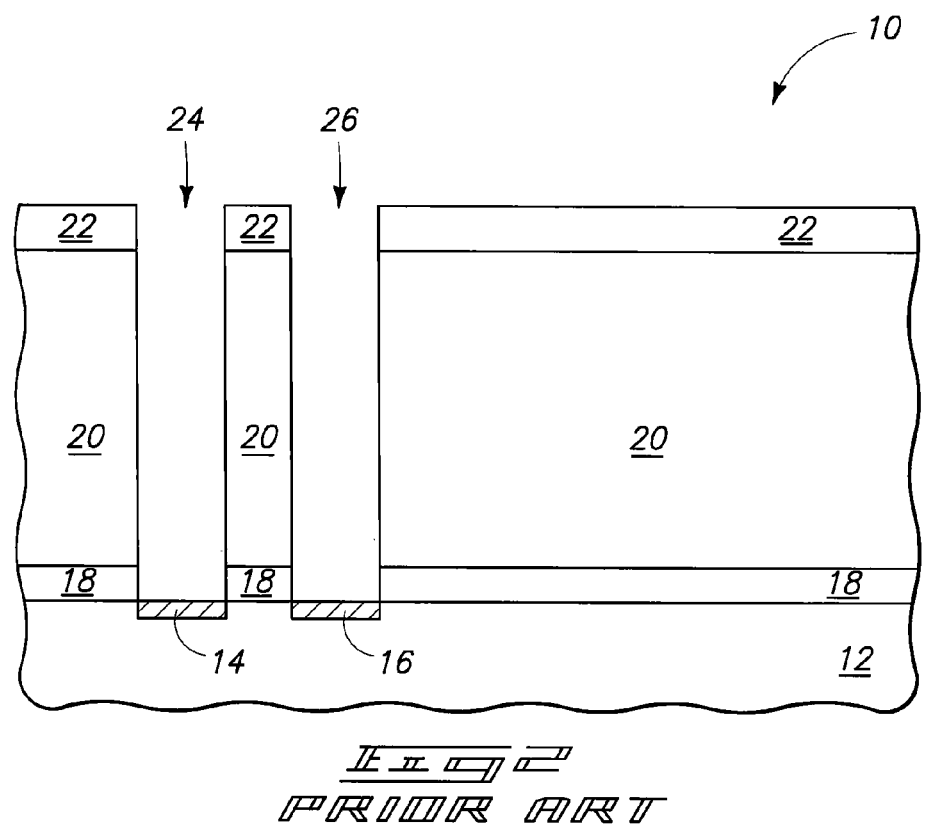
Figure 3:
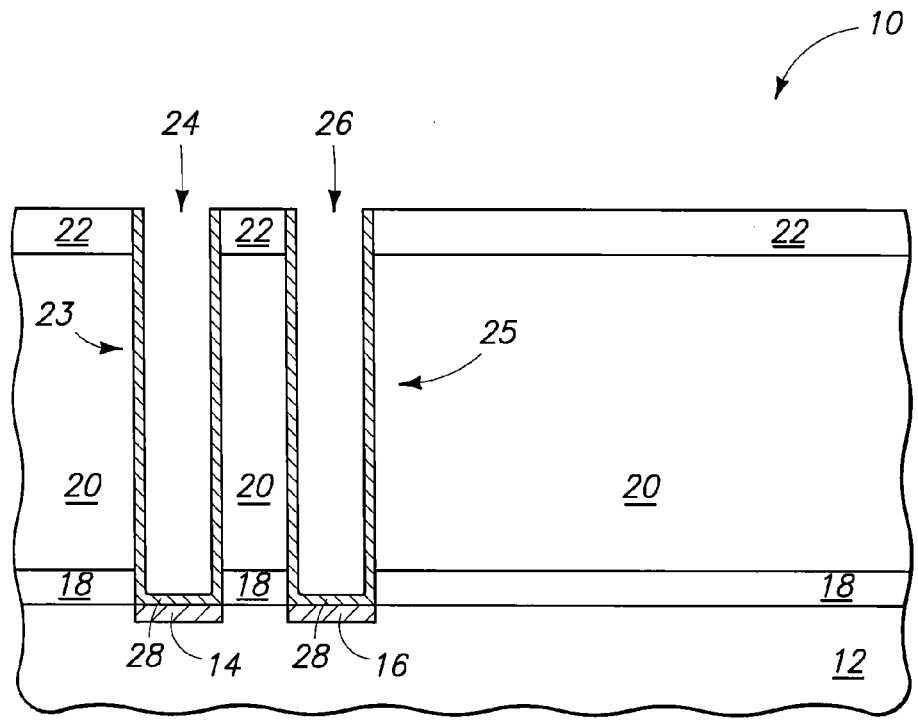
Figure 4:
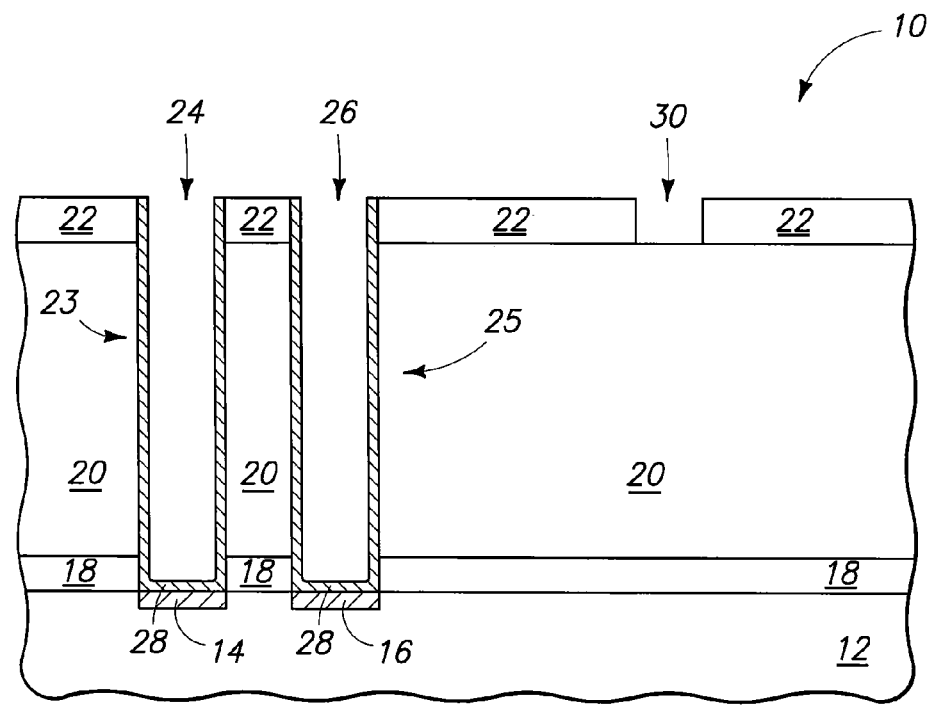

Referring to FIG. 6, construction 10 of prior art FIG. 1 is shown at a processing stage subsequent to that of prior art FIG. 3. The construction includes the base 12, electrically conductive nodes 14 and 16, and materials 18, 20 and 22 discussed previously. The construction further includes the openings 24 and 26 patterned within materials 18, 20 and 22; and extending entirely through the materials 18, 20 and 22. Also, the construction of FIG. 6 includes the storage nodes 23 and 25 comprising the material 28 formed within the openings 24 and 26. Additionally, the opening 30 has been formed through material 22.

The various materials of FIG. 6 may be identical to those described above with reference to prior art FIGS. 1-5. Accordingly, material 18 may comprise, consist essentially, or consist of silicon dioxide; material 20 may be a support material comprising, consisting essentially of, or consisting of doped silicate glass (for instance, BPSG or PSG); material 22 may be a lattice material comprising, consisting essentially of, or consisting of silicon nitride; and storage node material 28 may comprise, consist essentially of or consist of metal nitride, such as, for example, titanium nitride.

In some embodiments, material 20 may be referred to as a silicon dioxide-containing material, and material 28 may be referred to as a metal-containing material.

Storage nodes 23 and 25 are container-shaped storage nodes. Container-shaped storage node 23 has inner sidewall surfaces 51 and outer sidewall surfaces 53; and similarly, container-shaped storage node 26 has inner sidewall surfaces 55 and outer sidewall surfaces 57. The storage nodes 23 and 25 also have top surfaces 47 and 49, respectively. The container-shaped storage nodes may have any suitable shape, and in some embodiments will be circular or elliptical when viewed from above, similar to the storage nodes described in U.S. Patent Publication Number 2005/0054159.

Some etching of support material 20 has occurred at the processing stage of FIG. 6. Such etching has exposed portions of outer sidewall surfaces 53 and 57 of storage nodes 23 and 25, respectively; and has left other portions of the outer sidewall surfaces remaining covered by support material 20. The covered portions of the outer sidewall surfaces may be referred to as unexposed regions 61 and 63 of the storage nodes 23 and 25, respectively; and the exposed portions of the outer sidewall surfaces may be referred to as exposed segments 65 and 67 of the storage nodes 23 and 25, respectively.

The etching of material 20 may be accomplished with an isotropic etch similar to the etch discussed above with reference to prior art FIG. 5. Accordingly, the etching of material 20 may utilize an aqueous etchant comprising about 5% (by volume) hydrofluoric acid in water. Subsequently, the aqueous etchant may be rinsed from construction 10, and the construction dried to leave the construction at the processing stage of FIG. 6.

The construction of FIG. 6 does not have the stiction problems discussed above with reference to prior art FIG. 5, because the support material 20 has not been removed to a level that would enable such stiction to occur. The amount of material 20 removed may be less than or equal to about half of the total thickness of material 20 that was initially present (in other words, the thickness of material 20 at the processing stage of FIG. 4). In some embodiments, material 20 may be formed to have a thickness of from about 1000 nanometers (in other words, about 1 micron) to about 3000 nanometers at the processing stage of FIG. 4, and the amount of material 20 removed at a processing stage of FIG. 6 may be from about 500 nanometers to about 2500 nanometers.

Figure 7:
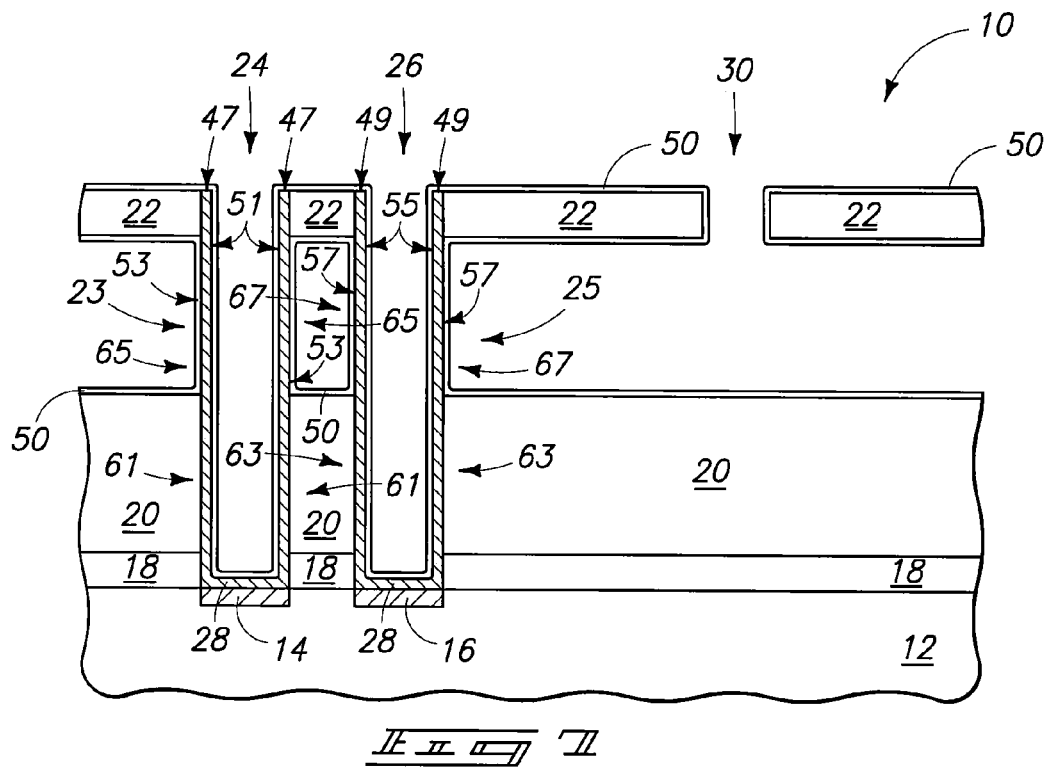

Referring to FIG. 7, a material 50 is formed along the exposed segments 65 and 67 of the outer sidewall surfaces of the storage nodes 23 and 25, respectively. Material 50 may comprise any material which avoids the stiction discussed above with reference to FIG. 5. In some embodiments, material 50 may be a hydrophobic material to which an aqueous solution has a contact angle of at least 60°, at least 70°, at least 90°, or at least 100°. In some embodiments, material 50 may be a non-wetting material, (i.e., a material to which an aqueous solution has a contact angle of at least 90°).

Material 50 may, for example, correspond to material formed utilizing one or more halogen-and-silicon-containing compositions as precursors; and in some embodiments may be formed utilizing one or more halogen-containing silanes as precursors. In some embodiments, material 50 may be formed from one or more of the precursors dimethyldichlorosilane, perfluorooctyltrichlorosilane and perfluorodecanoic acid. Accordingly, in some embodiments material 50 may consist of silicon and carbon; or may consist of silicon, carbon, and oxygen; or may consist of silicon, carbon and halogen; or may consist of silicon, carbon, halogen and oxygen.

Material 50 may be considered to be coated on the storage nodes, and accordingly to form a coating along the exposed surfaces of the storage nodes. Such coating may be formed to any suitable thickness. In some embodiments the coating may be formed to be only a few molecules thick, and in other embodiments the coating may be formed to be 10 or more molecules thick. If the coating of material 50 is formed to be more than a few molecules thick, such coating may correspond to a mat extending around the storage nodes and providing significant structural support to the storage nodes.

Material 50 is shown formed along all exposed surfaces of construction 10, and accordingly extends along exposed surfaces of materials 20 and 22, in addition to the exposed surfaces of storage node material 28. In other embodiments, material 50 may be selectively formed so that the material 50 is only along exposed surfaces of storage node material 28. FIG. 11 shows an example embodiment in which material 50 is selectively formed only along exposed surfaces of storage node material 28.

Figure 8:
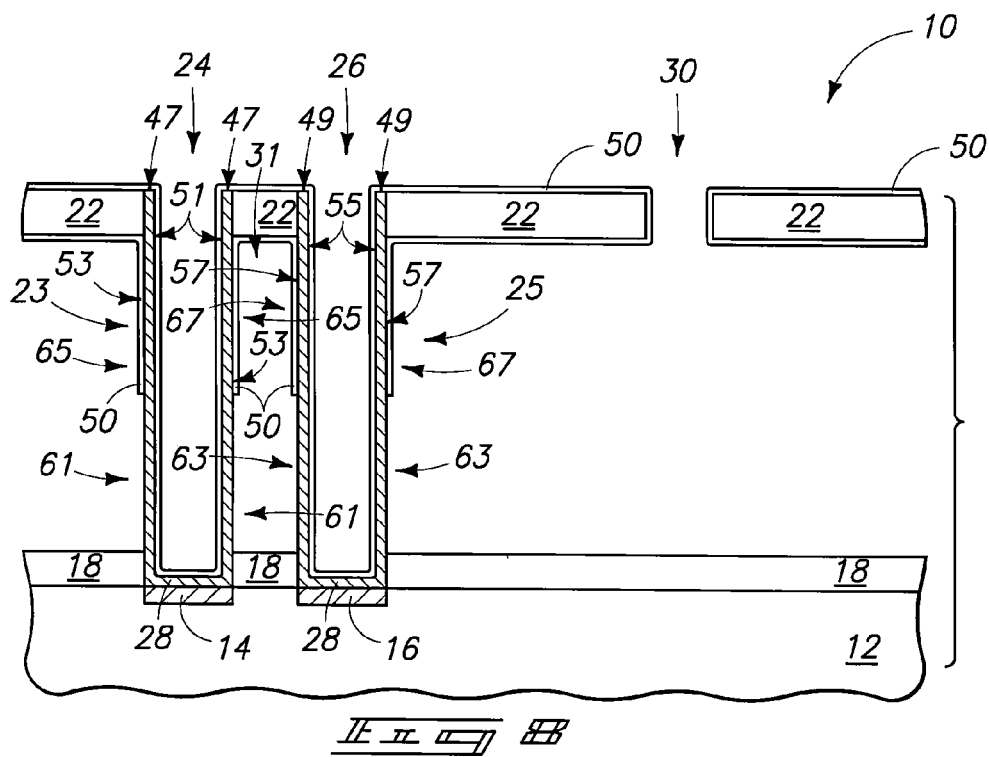

Referring to FIG. 8, a remaining portion of support material 20 (FIG. 7) is removed. Such exposes the portions 61 and 63 of the outer sidewall surfaces 53 and 57 of storage nodes 23 and 25. Material 20 may be removed with the aqueous hydrofluoric acid etch, rinsing and drying discussed above relative to prior art FIG. 5. In embodiments like those of FIG. 11 in which coating 50 does not cover material 20, the material 20 may be removed with only the processing discussed above with reference to prior art FIG. 5. In contrast, in embodiments like that of FIG. 7 in which coating 50 covers an upper surface of material 20, it may be desired to utilize an additional step of punching through material 50 to expose material 20 prior to the isotropic etching of material 20. Such punch-through of material 50 may be accomplished with an etch conducted through the opening 30 that extends through lattice material 22. Accordingly, in some embodiments lattice material may be utilized as a patterned mask having the opening 30 extending therethrough, with such opening defining a region of material 50 that is to be exposed to a punch-through etch.

Material 50 is a material resistant to the etching and rinsing utilized to remove material 20, and accordingly material 50 remains to protect the upper outer sidewall surfaces 65 and 67 of storage nodes 23 and 25, respectively. The capillary 31 discussed above with reference to prior art FIG. 5 is present in the embodiment of FIG. 8. However, in the embodiment of FIG. 8, in contrast to the prior art process of FIG. 5, such capillary has not lead to stiction between the adjacent outer sidewall surfaces of the storage nodes 23 and 25. The hydrophobic and/or non-wetting properties of material 50 alleviate adhesion within the capillary 31, and thus the stiction between the outer sidewall surfaces of the adjacent capacitor storage nodes is avoided. In some embodiments, material 50 causes beading of aqueous solution from its surface, and or changes a meniscus of aqueous solution within capillary 31 from concave to convex. In some embodiments, some stiction may occur in spite of material 50, but material 50 can still provide an advantage in that it can provide insulation between adjacent storage nodes to avoid electrical shorting of the storage nodes.

Figure 9:
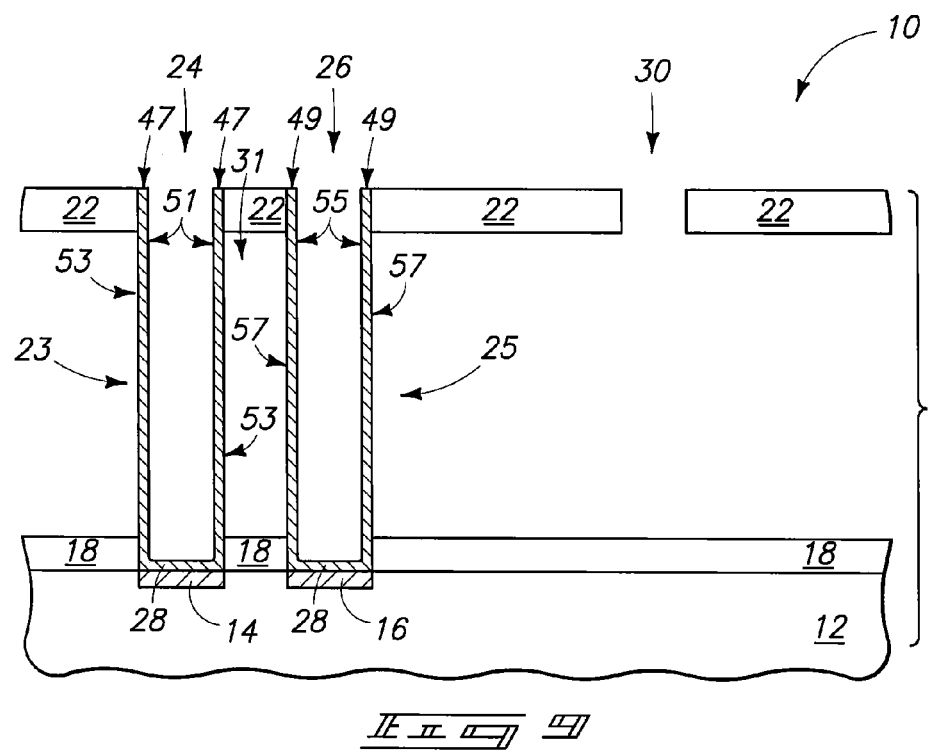

Referring to FIG. 9, material 50 (FIG. 8) is removed. Such removal may be accomplished utilizing any suitable processing. The processing may be a dry etch to avoid having water entering capillary 31 during or after removal of material 50. The removal of material 50 may, for example, utilize thermal treatment at a temperature of at least about 100° C., such as, for example, thermal treatment utilizing a temperature of from about 100° C. to about 400° C. An oxidant may be utilized during the thermal treatment, with suitable oxidants being oxygen-containing oxidants selected from the group consisting of $O_2$, $O_3$, and mixtures thereof. Alternatively, other suitable materials, such as, for example, ammonia, may be utilized during the thermal treatment. In some embodiments, the thermal treatment may utilize a temperature of greater than 200° C. For instance, films formed from octyltrichlorosilane derivatives may thermally degrade at temperatures of greater than or equal to about 225° C., which can render them suitable for decomposition and desorption at temperatures traditionally utilized for dielectric deposition, (i.e., temperatures of about 275° C.).

Figure 10:
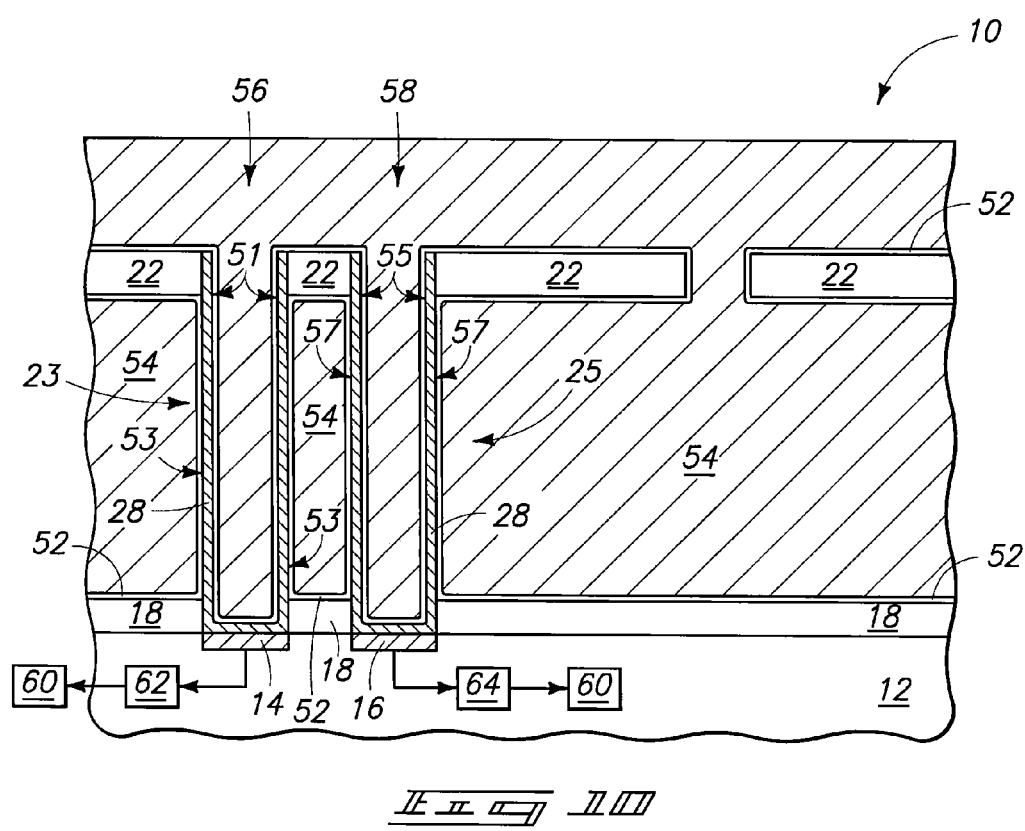
Figure 11:
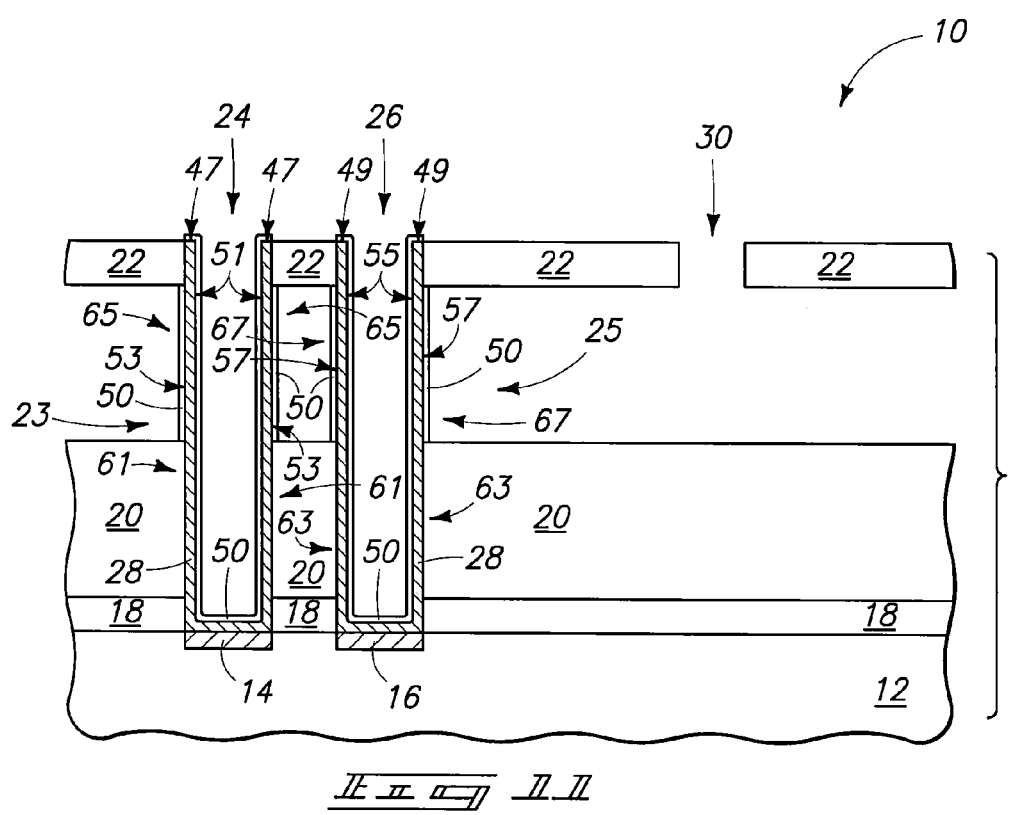
FIG. 11 is a diagrammatic cross-sectional view of a portion of a semiconductor construction illustrating a process stage of an example embodiment process for forming capacitors. The process stage of FIG. 11 is subsequent to that of FIG. 6.

Referring to FIG. 10, capacitor dielectric material 52 is formed along the inner and outer sidewall surfaces 51 and 53 of capacitor storage node 23; and also along the inner and outer sidewall surfaces 55 and 57 of capacitor storage node 25. Subsequently, capacitor electrode material 54 is formed over the capacitor dielectric material. The capacitor electrode material 54 may be considered to form a capacitor plate that extends across multiple capacitors.

The capacitor dielectric material and capacitor electrode material may comprise any suitable compositions. For instance, the capacitor dielectric material may comprise any of various electrically insulative oxides and nitrides; and the capacitor electrode material may comprise any of various electrically conductive compositions, including, for example, metals (e.g., platinum, titanium, tungsten, ruthenium, etc.), metal-containing compositions (e.g., metal nitride, metal silicides, etc.) and conductively-doped semiconductor materials (e.g., conductively-doped silicon, conductively-doped germanium, etc.).

If the coating 50 degrades at the temperature utilized for forming dielectric 52, the deposition of the dielectric 52 and removal of the coating 50 may be accomplished in a common reaction chamber without breaking vacuum to the chamber, and in some embodiments may even be accomplished in a common processing step so that coating 50 is being volatilized as dielectric 52 is being deposited.

The capacitor electrode material 54, dielectric material 52 and storage node 23 together form a container-type capacitor 56; and the capacitor electrode material 54, dielectric material 52 and storage node 25 together form a container-type capacitor 58. The capacitors 56 and 58 may be electrically coupled to a bitline 60 through transistor gates 62 and 64. The bitlines and transistor gates are diagrammatically illustrated in FIG. 10, and may comprise conventional constructions. The bitlines and transistor gates may be formed at any appropriate processing stage, and may, for example, be present prior to the processing stage of FIG. 6. The transistor gates 62 and 64 may be comprised by wordlines, and such wordlines in combination with the bitlines, enable unique addressing of dynamic random access memory (DRAM) cells comprising capacitors 56 and 58. Thus, capacitors 56 and 58 may be incorporated into a DRAM array.

The shown construction utilizes a common bitline to address capacitors 56 and 58, as would occur if the capacitors were along a common row as one another in the DRAM array. In other embodiments, adjacent capacitors 56 and 58 may be addressed by a common wordline and by different bitlines from one another, if the adjacent capacitors are along a common column of the memory array.

In the shown embodiment, material 50 (FIG. 8) is removed prior to formation of capacitor dielectric material 52. In other embodiments, material 50 may remain and be covered by capacitor dielectric material 52 so that material 50 becomes part of the capacitor dielectric of the finished capacitor constructions.

FIGS. 6-11 describe an embodiment for forming container-type capacitors. In other embodiments, stud-type capacitors may be formed. FIGS. 12-18 illustrate an example embodiment for forming stud-type capacitors. Similar numbering will be used for describing FIGS. 12-18 as is used above for describing FIGS. 6-11, where appropriate.

Figure 12:
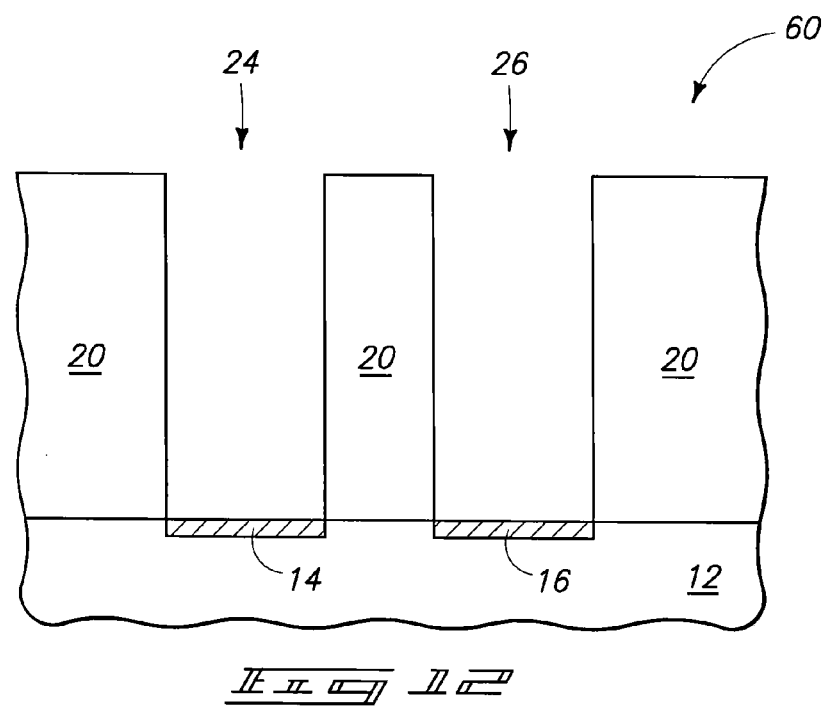

Referring to FIG. 12, a construction 60 is illustrated at a processing stage during a fabrication sequence utilized for forming stud-type capacitors. The processing stage of FIG. 12 is similar to that of prior art FIG. 4. The construction 60 includes the base 12, electrical nodes 14 and 16, and support material 20 discussed above with reference to prior art FIGS. 1-4. Openings 24 and 26, analogous to those of FIG. 4, have been patterned through material 20 to expose upper surfaces of electrical nodes 14 and 16. Construction 60 differs from the construction 10 of FIG. 4 in that materials 18 and 22 have been omitted. In other embodiments, one or both of materials 18 and 22 may be present during fabrication of stud-type capacitors.

Referring to FIG. 13, storage node material 62 is formed within openings 24 and 26. The storage node material forms storage node pedestals 64 and 66 within the openings 24 and 26, respectively. The storage node material may comprise any suitable electrically conductive composition, or combination of compositions; and may, for example, comprise one or more of various metals (e.g., platinum, titanium, tungsten, ruthenium, etc.), metal-containing compositions (e.g., metal nitride, metal silicides, etc.) and conductively-doped semiconductor materials (e.g., conductively-doped silicon, conductively-doped germanium, etc.).

The storage node pedestal 64 comprises an upper surface 65, and comprises sidewall surfaces 67; and similarly, the storage node pedestal 66 comprises an upper surface 69, and comprises sidewall surfaces 71. The sidewall surfaces 67 and 71 may be referred to as outer sidewall surfaces in analogy to the outer sidewall surfaces 53 and 57 of the container-type storage nodes of FIGS. 6-11.

Referring to FIG. 14, material 20 is subjected to an etch which partially removes the material. The partial removal of material 20 exposes upper segments 68 and 70 of sidewall surfaces 67 and 71, respectively; while leaving lower segments 72 and 74 of the surfaces 67 and 71 remaining covered by material 20. The material 20 may be removed by the hydrofluoric acid etch, rinsing and drying discussed above with reference to FIG. 5.

Figure 15:
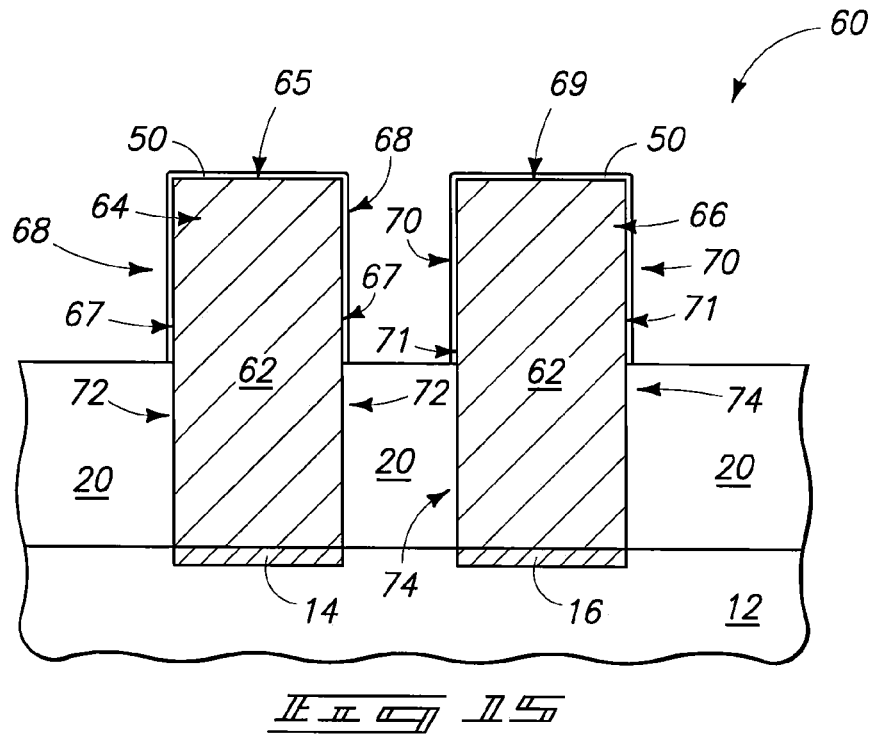

Referring to FIG. 15, material 50 is formed along exposed surfaces of storage node material 62. In the shown embodiment, material 50 is selectively formed along exposed surfaces of storage node material 62 relative to exposed surfaces of support material 20. In other embodiments, material 50 may be formed non-selectively so that material 50 is formed along both the exposed surfaces of material 20 and the exposed surfaces of storage node material 62.

Figure 16:
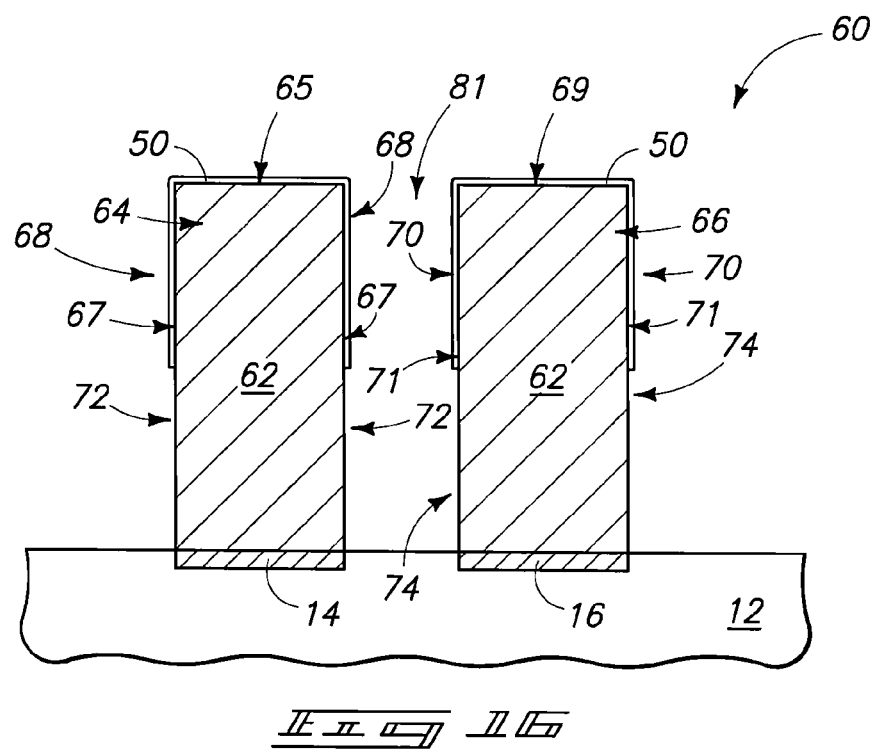

Referring to FIG. 16, a remaining portion of material 20 is removed to expose segments 72 and 74 of surfaces 67 and 71, respectively. A capillary 81 analogous to the capillary 31 of FIGS. 5 and 8 is present during removal of material 20. Such capillary could lead to stiction between the adjacent storage node pillars 64 and 66 in the absence of material 50. However, material 50 reduces adhesion within the capillary relative to that which would exist in the absence of material 50, and thus eliminates such stiction.

Figure 17:
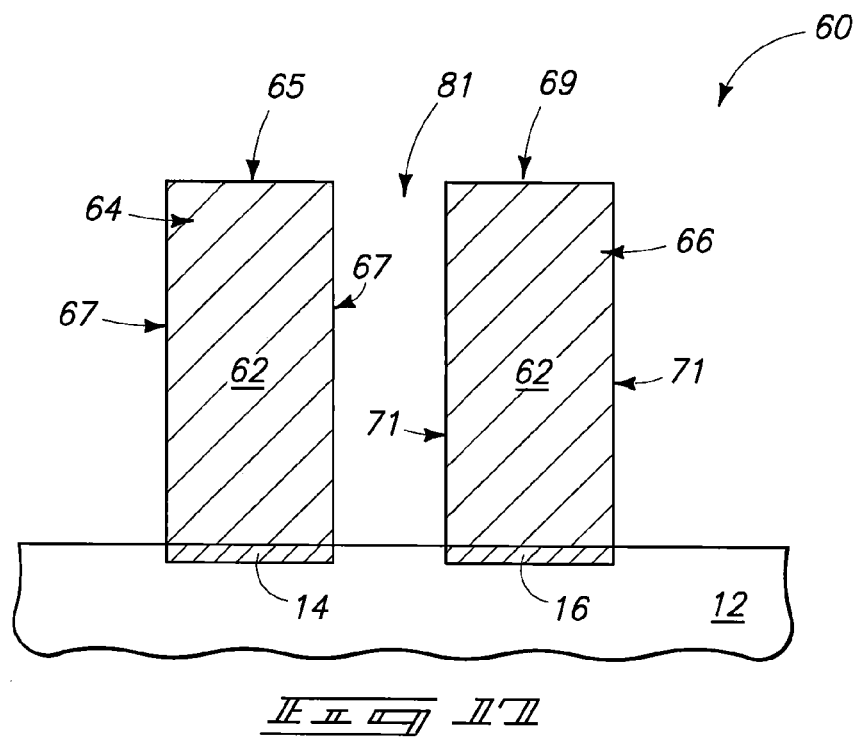

Referring to FIG. 17, material 50 (FIG. 16) is removed. Such removal can utilize one or more of the methods discussed above with reference to FIG. 9.

Figure 18:
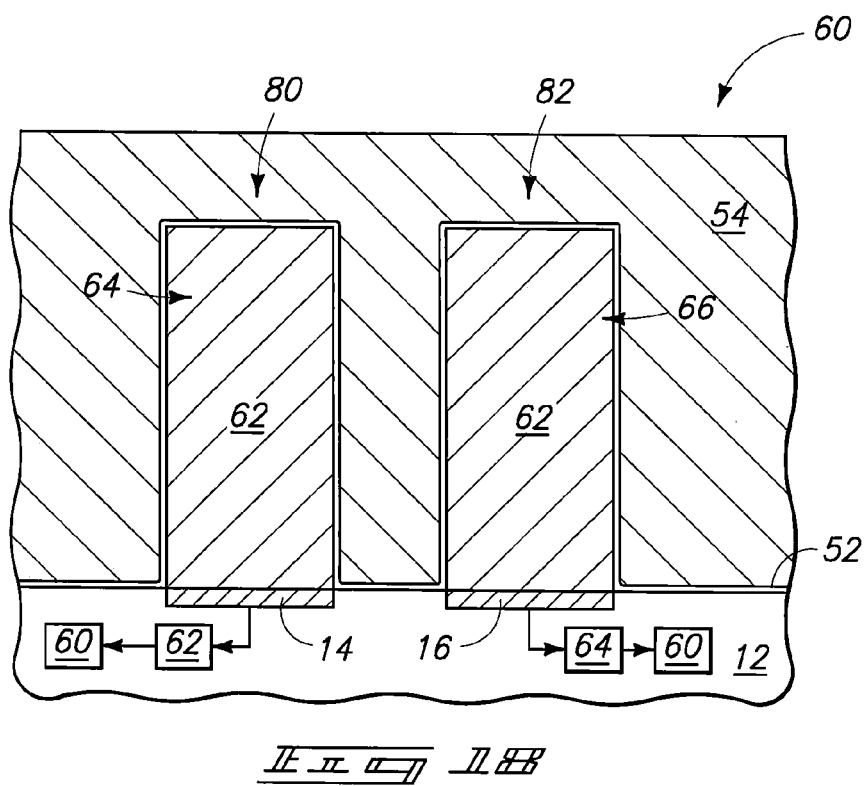

Referring to FIG. 18, dielectric material 52 and capacitor electrode material 54 are formed over and around storage nodes 64 and 66. The storage node 64 corresponds to a stud, and, together with dielectric material 52 and capacitor electrode material 54 forms a stud-type capacitor 80. Similarly, the storage node 66 corresponds to a stud, and, together with dielectric material 52 and capacitor electrode material 54 forms a stud-type capacitor 82. The capacitors 80 and 82 may be incorporated into a DRAM array. In the shown embodiment, the capacitors are connected through transistor gates 62 and 64 to a bitline 60, analogous to the connections discussed above with reference to FIG. 10.

The processing of FIG. 6-18 utilizes a coating 50 during fabrication of capacitors to avoid stiction between adjacent capacitors. The coating may also be utilized in other embodiments in which is desired to avoid stiction between adjacent structures. For instance, the coating may be utilized to coat adjacent silicon dioxide-containing masking structures to avoid stiction between such structures as discussed with reference to FIGS. 19-23.

Figure 19:
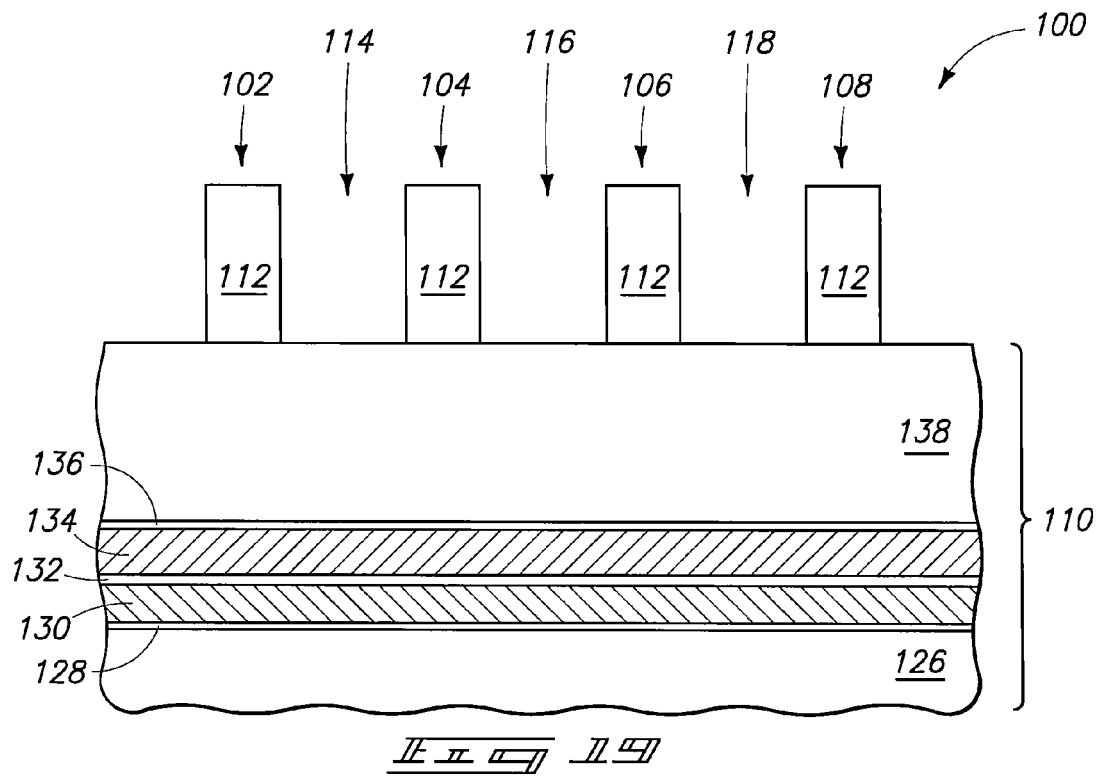
FIGS. 19-23 are diagrammatic cross-sectional views of a portion of a semiconductor construction illustrating various stages of an example embodiment process utilizing a silicon dioxide-containing mask to pattern materials associated with a semiconductor substrate.

FIG. 19 shows a construction 100 comprising a silicon dioxide-containing masking structure comprising a plurality of features 102, 104, 106 and 108. The masking structure is over a substrate 110. The masking structure is formed of a material 112 which may comprise, consist essentially of, or consist of silicon dioxide. A plurality of openings 114, 116 and 118 extend through the masking structure to an upper surface of the substrate.

The masking structure may be formed by forming a layer of material 112 over the substrate, providing a photolithographically-patterned photoresist mask (not shown) over material 112; transferring a pattern from the photoresist mask to material 112 with an etch, and then removing the photoresist.

Substrate 110 comprises a semiconductor base 126, a gate dielectric 128, an electrically conductive charge-retaining material 130, an intergate dielectric material 132, an electrically conductive control gate material 134, an electrically insulative cap material 136, and a pattern-transfer material 138. The gate dielectric 128, electrically conductive charge-retaining material 130, intergate dielectric material 132, electrically conductive control gate material 134, and electrically insulative cap material 136 together correspond to a controlled gate stack (e.g., a flash gate stack), and ultimately are to be patterned into a plurality of controlled gates.

Base 126 may, for example, comprise, consist essentially of, or consist of monocrystalline silicon.

Gate dielectric 128 may, for example, comprise, consist essentially of, or consist of silicon dioxide.

Charge-retaining material 130 may, for example, comprise, consist essentially of, or consist of one or more of metal (for instance, tungsten, titanium, etc.), metal-containing compositions (for instance, metal silicide, metal nitride, etc.) and conductively-doped semiconductor material (for instance, conductively-doped silicon).

Intergate dielectric material 132 may, for example, comprise a layer of silicon nitride between a pair of layers of silicon dioxide (a so-called ONO stack).

Control gate material 134 may, for example, comprise, consist essentially of, or consist of one or more of metal (for instance, tungsten, titanium, etc.), metal-containing compositions (for instance, metal silicide, metal nitride, etc.) and conductively-doped semiconductor material (for instance, conductively-doped silicon).

Insulative cap material 136 may, for example, comprise, consist essentially of, or consist of one or more of silicon dioxide, silicon nitride and silicon oxynitride.

Pattern transfer material 138 may, for example, comprise, consist essentially of, or consist of transparent carbon or amorphous carbon.

Figure 20:
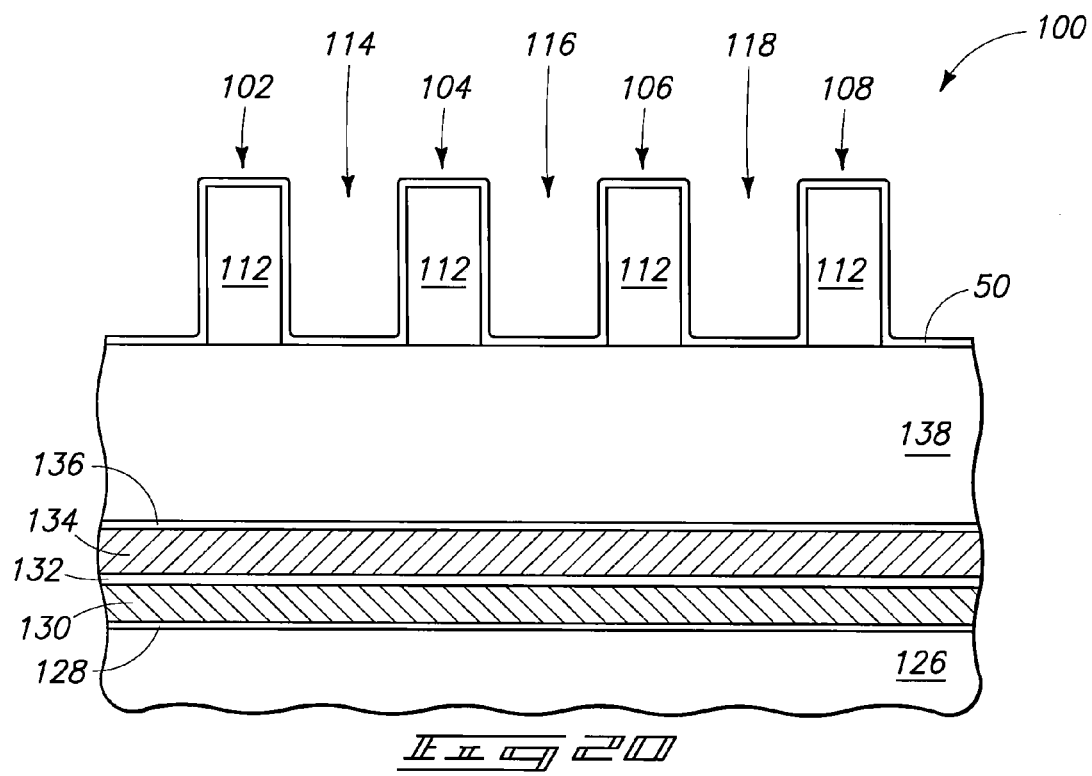

Referring to FIG. 20, material 50 is formed over and around features 102, 104, 106 and 108 of the silicon dioxide-containing masking structure. Material 50 may comprise any of the compositions discussed previously for material 50, and may, for example, comprise a non-wetting material and/or a hydrophobic material. In the shown embodiment, material 50 extends across all exposed surfaces, rather than just across the exposed surfaces of silicon dioxide-containing material 112. In other embodiments, material 50 may be selectively formed to be only along surfaces of silicon dioxide-containing material 112.

Figure 21:
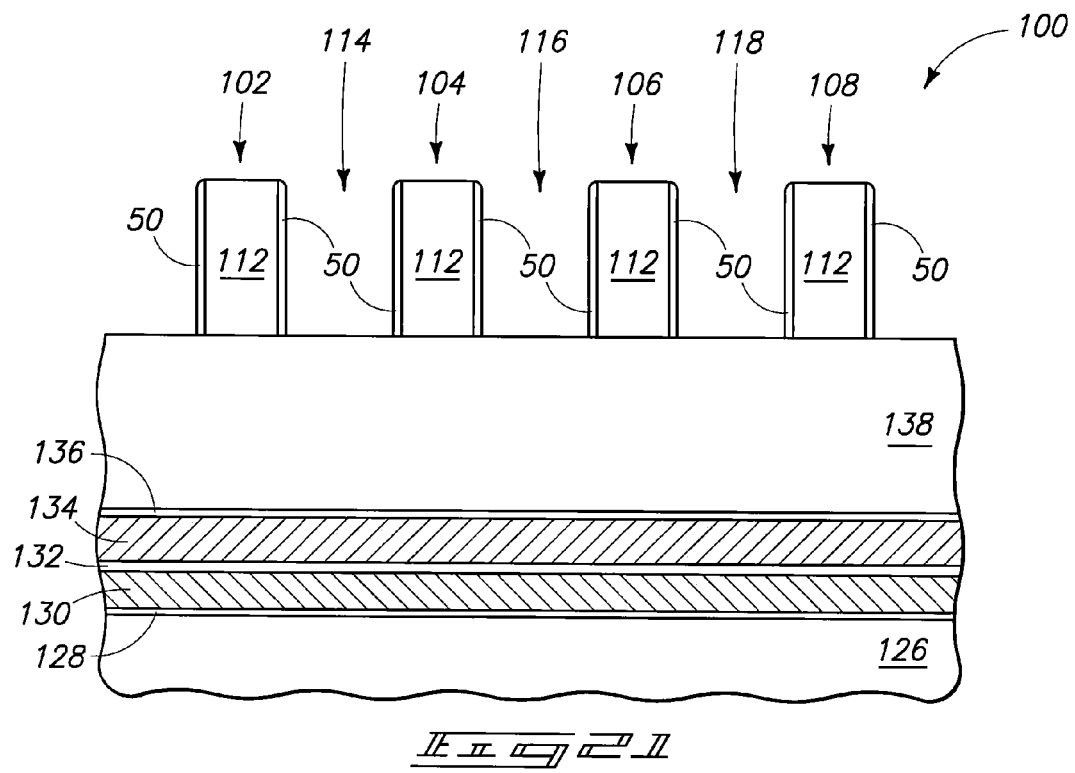

Referring to FIG. 21, material 50 is subjected to an anisotropic etch to remove the material 50 from over material 138. Although an anisotropic etch is described, material 50 may be removed from over material 138 with any suitable etch. In some embodiments, a protective mask (not shown) may be formed over regions of material 50 which are not to be removed, an etch then conducted to remove portions of material 50 that are not protected by the mask, and then the mask may be removed to leave a construction in which material 50 only remains along silicon dioxide-containing material 112.

Figure 22:
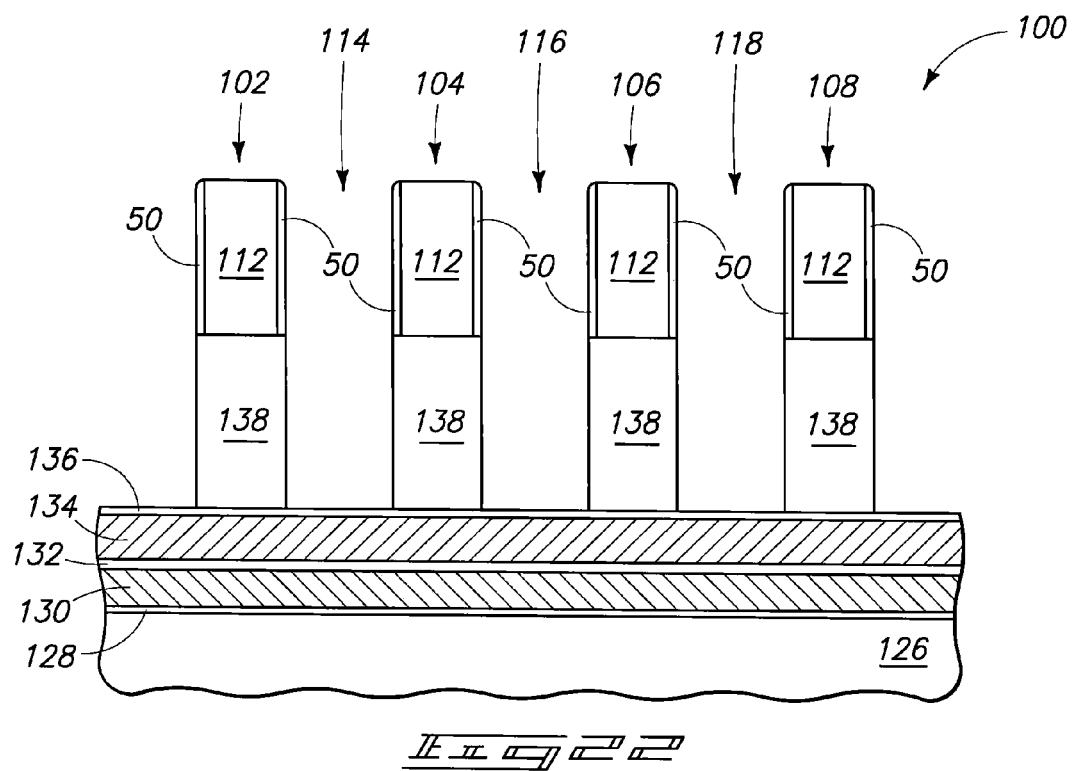

Referring to FIG. 22, the silicon dioxide-containing masking structure is utilized to pattern underlying material 138.

Figure 22A:
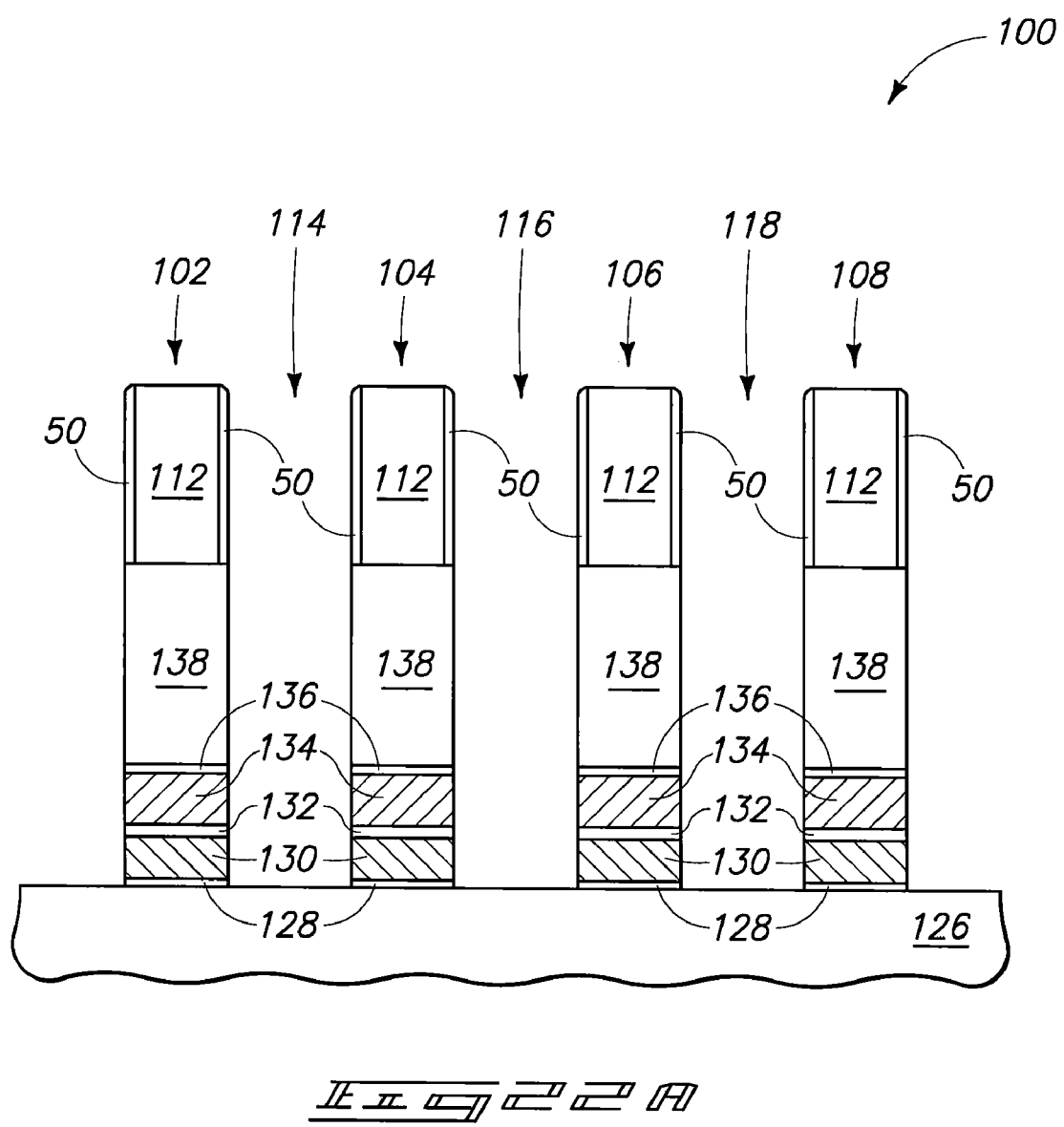

Referring to FIG. 22A, materials 128, 130, 132, 134 and 136 are patterned; and materials 138, 112 and 50 are then removed as shown in FIG. 23. The patterning of various materials 128, 130, 132, 134, 136 and 138 may utilize one or more aqueous solutions, and material 50 may alleviate stiction that could occur between adjacent masking features during such patterning, (with the masking features being the features 102, 104, 106 and 108 in FIG. 19). In some embodiments (not shown), a hydrophobic coating may be formed on material 136 (the capping oxide) after material 136 is patterned to avoid stiction during a wet clean that may follow the patterning of material 136.

Materials 138, 112 and 50 may be removed at any appropriate stages relative to one another. For instance, in some embodiments, materials 112 and 50 may be removed after patterning of material 138, and prior to transfer of a pattern from material 138 into the materials underlying material 138. In other embodiments, all of materials 112, 50 and 138 may be together removed after patterning of materials 128, 130, 132, 134 and 136.

Although material 50 and silicon dioxide-containing material 112 are removed from the completed structures in the embodiment of FIG. 23, in other embodiments, one or both of the materials 50 and 112 may remain in completed structures formed utilizing materials 50 and 112 as a mask.

The construction of FIG. 23 has a plurality of flash transistor gates 152, 154, 156 and 158 at locations originally defined by the silicon dioxide-containing masking structure features 102, 104, 106 and 108 of FIG. 19. The gates 152, 154, 156 and 158 may be incorporated into any suitable integrated circuitry, and may, for example, be utilized in NAND memory. Thus, the gates 152, 154, 156 and 158 may be considered NAND structures (i.e., structures comprised by a NAND memory array).

Embodiments described herein are example embodiments, and the stiction-avoiding processes described herein may be utilized in other applications besides those specifically described.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of utilizing a silicon dioxide-containing masking structure, comprising:
   forming a silicon dioxide-containing masking structure over a substrate; the masking structure comprising a silicon dioxide-containing material, and having a plurality of openings extending therethrough; the silicon dioxide-containing material having exposed surfaces along the openings;
   coating the exposed surfaces of the silicon dioxide-containing material with non-wetting material comprising silicon and carbon; and
   after coating the exposed surfaces of the silicon dioxide-containing material, utilizing the silicon dioxide-containing masking structure as a mask during an etch of the substrate.

2. The method of claim 1 further comprising removing the non-wetting material after utilizing the silicon dioxide containing masking structure as a mask.

3. The method of claim 1 wherein the substrate comprises a stack of materials utilized in forming NAND structures, and wherein the etch of the substrate at least partially forms said NAND structures from the stack of materials.

4. A method of utilizing a silicon dioxide-containing masking structure, comprising:
   forming a silicon dioxide-containing masking structure over a substrate; the masking structure comprising spaced-apart features; the features having sidewall surfaces and top surfaces; a surface of the substrate being exposed within the spaces between the features;
   forming non-wetting material along the sidewall and top surfaces of the features and across the surface of the substrate within spaces between the features; the non-wetting material being directly against silicon dioxide of the features;
   anisotropically etching the non-wetting material to remove the non-wetting material that is not along sidewall surfaces of the features;
   after the anisotropic etching, using the non-wetting material along the sidewall surfaces of the features, together with the features, as a mask during an etch of the substrate.

5. The method of claim 4 wherein the forming the non-wetting material comprises utilization of one or more halogen-containing silanes as precursors of the non-wetting material.

6. The method of claim 4 wherein the forming the non-wetting material comprises utilization of one or more of dimethyldichlorosilane, perfluoro-ooctyltrichlorosilane and perfluorodecanoic acid as precursors of the non-wetting material.

7. The method of claim 4 wherein the silicon dioxide-containing masking structure consists of silicon dioxide.

8. The method of claim 4 wherein the substrate comprises a stack of materials utilized in forming NAND structures, and wherein the etch of the substrate at least partially forms said NAND structures from the stack of materials.

9. A method of utilizing a silicon dioxide-containing masking structure, comprising:
   providing a substrate which comprises a semiconductor base, and, in ascending order from the base, a gate dielectric, an electrically conductive charge-retaining material, an intergate dielectric material, an electrically conductive control gate material, an electrically insulative cap material, and a pattern-transfer material;
   forming a silicon dioxide-containing masking structure over the pattern-transfer material; the masking structure comprising spaced-apart features; the features having sidewall surfaces and top surfaces; a surface of the pattern-transfer material being exposed within the spaces between the features;
   forming non-wetting material along the sidewall and top surfaces of the features and across the surface of the pattern-transfer material within spaces between the features;
   anisotropically etching the non-wetting material to remove the non-wetting material that is not along sidewall surfaces of the features;
   after the anisotropic etching, using the non-wetting material along the sidewall surfaces of the features, together with the features, as a mask during an etch of the pattern-transfer material.

10. The method of claim 9 wherein the silicon dioxide-containing masking structure consists of silicon dioxide, and wherein the pattern-transfer material comprises carbon.

11. The method of claim 10 wherein the pattern-transfer material consists of carbon.

12. The method of claim 9 wherein the forming the non-wetting material comprises utilization of one or more halogen-containing silanes as precursors of the non-wetting material.

13. The method of claim 9 wherein the forming the non-wetting material comprises utilization of one or more of dimethyldichlorosilane, perfluoro-ooctyltrichlorosilane and perfluorodecanoic acid as precursors of the non-wetting material.

* * * * *

UNITED STATES PATENT AND TRADEMARK OFFICE
CERTIFICATE OF CORRECTION

PATENT NO. : 8,026,148 B2
APPLICATION NO. : 13/004967
DATED : September 27, 2011
INVENTOR(S) : Niraj B. Rana et al.

Page 1 of 1

It is certified that error appears in the above-identified patent and that said Letters Patent is hereby corrected as shown below:

In column 10, line 65, in Claim 6, delete "perfluoro-ooctyltrichlorosilane" and insert -- perfluoro-octyltrichlorosilane --, therefor.

In column 12, line 19, in Claim 13, delete "perfluoro-ooctyltrichlorosilane" and insert -- perfluoro-octyltrichlorosilane --, therefor.

Signed and Sealed this
Twentieth Day of December, 2011

David J. Kappos
*Director of the United States Patent and Trademark Office*